(12) United States Patent
Johnston et al.

(10) Patent No.: US 10,036,966 B2
(45) Date of Patent: Jul. 31, 2018

(54) ENVIRONMENTAL CONTROL OF SYSTEMS FOR PHOTOLITHOGRAPHY PROCESS

(71) Applicant: Applied Materials, Inc., Santa Clara, CA (US)

(72) Inventors: Benjamin M. Johnston, Los Gatos, CA (US); John White, Hayward, CA (US); Thomas Laidig, Richmond, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 3 days.

(21) Appl. No.: 15/364,748

(22) Filed: Nov. 30, 2016

(65) Prior Publication Data

US 2017/0168403 A1    Jun. 15, 2017

Related U.S. Application Data

(60) Provisional application No. 62/278,958, filed on Jan. 14, 2016, provisional application No. 62/266,467, filed on Dec. 11, 2015.

(51) Int. Cl.
*G03F 9/00* (2006.01)
*G03F 7/20* (2006.01)

(52) U.S. Cl.
CPC .......... *G03F 7/70808* (2013.01); *G03F 7/708* (2013.01); *G03F 7/70775* (2013.01); *G03F 7/70858* (2013.01); *G03F 7/70866* (2013.01); *G03F 7/70933* (2013.01); *G03F 9/00* (2013.01); *G03F 9/70* (2013.01); *G03F 9/7049* (2013.01); *G03F 9/7057* (2013.01); *G03F 2009/005* (2013.01)

(58) Field of Classification Search
None
See application file for complete search history.

(56) References Cited

U.S. PATENT DOCUMENTS

| 5,141,318 | A | * | 8/1992 | Miyazaki | ............ | G03F 7/70716 250/548 |
| 5,143,552 | A | * | 9/1992 | Moriyama | .......... | H01L 21/6715 118/319 |
| 2002/0050572 | A1 | * | 5/2002 | Nagahashi | .......... | G03F 7/70858 250/492.1 |
| 2013/0038866 | A1 | * | 2/2013 | Kren | ................ | H01L 21/68735 356/237.5 |
| 2014/0198307 | A1 | * | 7/2014 | Hamaya | ............. | G01B 9/02062 355/72 |

* cited by examiner

*Primary Examiner* — Michelle M Iacoletti
(74) *Attorney, Agent, or Firm* — Patterson + Sheridan LLP

(57) ABSTRACT

Embodiments of the present disclosure generally relate to systems and methods for performing photolithography processes. In one embodiment, laminar gas flow is provided inside a photolithography system during operation. With laminar gas flow instead of turbulent gas flow inside the system, accuracy of the measurement of the location of a substrate disposed inside the system is improved due to the improved signal integrity of interferometers.

10 Claims, 9 Drawing Sheets

ENVIRONMENTAL CONTROL OF SYSTEMS FOR PHOTOLITHOGRAPHY PROCESS

CROSS-REFERENCE TO RELATED APPLICATIONS

This application claims priority to U.S. Provisional Patent Application Ser. No. 62/266,467, filed on Dec. 11, 2015, and U.S. Provisional Patent Application Ser. No. 62/278,958, filed on Jan. 14, 2016, which herein are incorporated by reference.

BACKGROUND

Field

Embodiments of the present disclosure generally relate to systems and methods for processing one or more substrates, and more specifically to systems and methods for performing photolithography processes.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels sandwiched between two plates. When power from the power supply is applied across the liquid crystal material, an amount of light passing through the liquid crystal material may be controlled at pixel locations enabling images to be generated.

Microlithography techniques are generally employed to create electrical features incorporated as part of the liquid crystal material layer forming the pixels. According to this technique, a light-sensitive photoresist is typically applied to at least one surface of a substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features. During processing, particles in the ambient air may settle on the substrate and thus contaminate the substrate.

Therefore, an improved photolithography system is needed.

SUMMARY

Embodiments of the present disclosure generally relate to systems and methods for performing photolithography processes. In one embodiment, laminar gas flow is provided inside a photolithography system during operation. With laminar gas flow instead of turbulent gas flow inside the system, accuracy of the measurement of the location of a substrate disposed inside the system is improved due to the improved signal integrity of interferometers.

In one embodiment, a photolithography system includes a chuck having a substrate receiving surface, a processing unit disposed over the chuck, one or more gas vents disposed over the processing unit, a gas source coupled to the one or more gas vents, and an exhaust port disposed below the chuck.

In another embodiment, a photolithography system includes a chuck having a substrate receiving surface, a processing unit disposed over the chuck, one or more gas vents disposed over the chuck, a gas source coupled to the one or more gas vents, and an exhaust port disposed below the processing unit.

In another embodiment, a photolithography system includes a processing unit and a chuck having a substrate receiving surface. The chuck is disposed below the processing unit and movable in an X-direction and an Y-direction. The photolithography system further includes a plurality of interferometers for measuring a displacement of the chuck in the X-direction and the Y-direction.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments of the present disclosure generally relate to systems and methods for performing photolithography processes. In one embodiment, laminar gas flow is provided inside a photolithography system during operation. With laminar gas flow instead of turbulent gas flow inside the system, accuracy of the measurement of the location of a substrate disposed inside the system is improved due to the improved signal integrity of interferometers.

Figure 1:
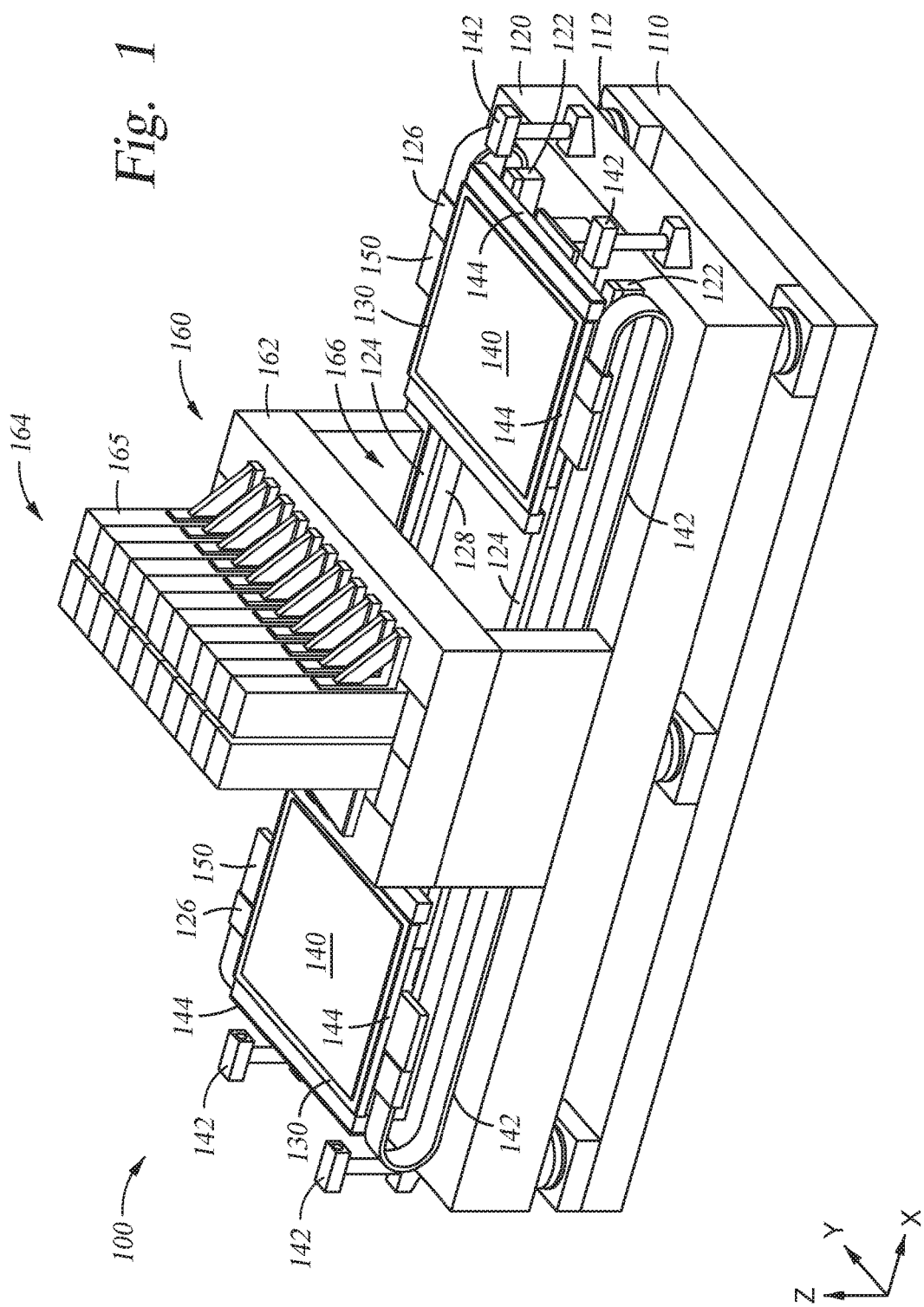
FIG. 1 is a perspective view of a system according to embodiments disclosed herein.

FIG. 1 is a perspective view of a system 100 according to embodiments disclosed herein. The system 100 includes a base frame 110, a slab 120, two or more chucks 130, and a processing apparatus 160. The base frame 110 may rest on the floor of a fabrication facility and may support the slab 120. Passive air isolators 112 may be positioned between the base frame 110 and the slab 120. The slab 120 may be a monolithic piece of granite, and the two or more chucks 130 may be disposed on the slab 120. In some embodiments, two chucks 130 are disposed on the slab 120 and the two chucks 130 are aligned in a first direction, such as the X-direction, as shown in FIG. 1. A substrate 140 may be supported by each of the two or more chucks 130. A plurality of holes (not shown) may be formed in each chuck 130 for allowing a plurality of lift pins (not shown) to extend therethrough. The lift pins may rise to an extended position to receive the substrate 140, such as from a transfer robot (not shown). The transfer robot may position the substrate 140 on the lift pins, and the lift pins may thereafter gently lower the substrate 140 onto each chuck 130.

The substrate 140 may, for example, be made of alkaline earth boro-aluminosilicate glass and be used as part of a flat panel display. In other embodiments, the substrate 140 may be made of other materials, such as a polymeric material. In some embodiments, the substrate 140 may have a photoresist layer formed thereon. A photoresist is sensitive to radiation and may be a positive photoresist or a negative photoresist, meaning that portions of the photoresist exposed to radiation will be respectively soluble or insoluble to photoresist developer applied to the photoresist after the pattern is written into the photoresist. The chemical composition of the photoresist determines whether the photoresist will be a positive photoresist or negative photoresist. For example, the photoresist may include at least one of diazonaphthoquinone, a phenol formaldehyde resin, poly(methyl methacrylate), poly(methyl glutarimide), and SU-8. In this manner, the pattern may be created on a surface of the substrate 140 to form the electronic circuitry.

The system 100 may further include a pair of supports 122 and a pair of tracks 124. The pair of tracks 124 may be supported by the pair of the supports 122, and the two or more chucks 130 may move along the tracks 124 in the X-direction. The track 124 and the supports 122 may be lifted by an air bearing system (not shown) during operation. In one embodiment, the pair of tracks 124 is a pair of parallel magnetic channels. As shown, each track 124 of the pair of tracks 124 is linear. In other embodiments, the track 124 may have a non-linear shape. Cable carriers 126 may be coupled to each chuck 130. Typically the system may include an encoder (not shown) for measuring the location information of the substrate 140. The chuck 130 is a distance away from the encoder in the Z-direction, and the distance may be 200 to 250 mm. Due to the stiffness of the structure, the actual location of the chuck 130 in the X-direction or Y-direction and the location of the chuck 130 measured by the encoder in the X-direction or the Y-direction may be off. In order to more accurately measure the location of the substrate 140 during operation, a plurality of interferometers 142 may be disposed on the slab 120, and the interferometers 142 are aligned with mirrors 144 coupled to each chuck 130. The mirrors 144 are located closer to the substrate 140 in the Z-direction than the encoder, thus the location information measured by the interferometers 142 is more accurate than the location information measured by the encoder. The chuck 130 may be a vacuum chuck that can secure the substrate 140 to the chuck 130, so the difference in location between the chuck 130 and the substrate 140 is minimized. The interferometers 142 may be any suitable interferometers, such as high stability plane mirror interferometers. The location information of the substrate 140 measured by the interferometers 142 may be provided to the controller (not shown), and the controller controls the motion of the chucks 130.

The processing apparatus 160 may include a support 162 and a processing unit 164. The support 162 may be disposed on the slab 120 and may include an opening 166 for the two or more chucks 130 to pass under the processing unit 164. One or more interferometers 142 may be disposed on the slab 120 under the support 162. The processing unit 164 may be supported by the support 162. In one embodiment, the processing unit 164 is a pattern generator configured to expose a photoresist in a photolithography process. In some embodiments, the pattern generator may be configured to perform a maskless lithography process. The processing unit 164 may include a plurality of image projection systems disposed in a case 165. The processing apparatus 160 may be utilized to perform maskless direct patterning. During operation, one of the two or more chucks 130 moves in the X-direction from a loading position, as shown in FIG. 1, to a processing position. The processing position may refer to one or more positions of the chuck 130 as the chuck 130 passes under the processing unit 164. During operation, the two or more chucks 130 may be lifted by a plurality of air bearings (not shown) and may move along the pair of tracks 124 from the loading position to the processing position. A plurality of vertical guide air bearings (not shown) may be coupled to each chuck 130 and positioned adjacent an inner wall 128 of each support 122 in order to stabilize the movement of the chuck 130. Each of the two or more chucks 130 may also move in the Y-direction by moving along a track 150 for processing and/or indexing the substrate 140.

Figure 2:
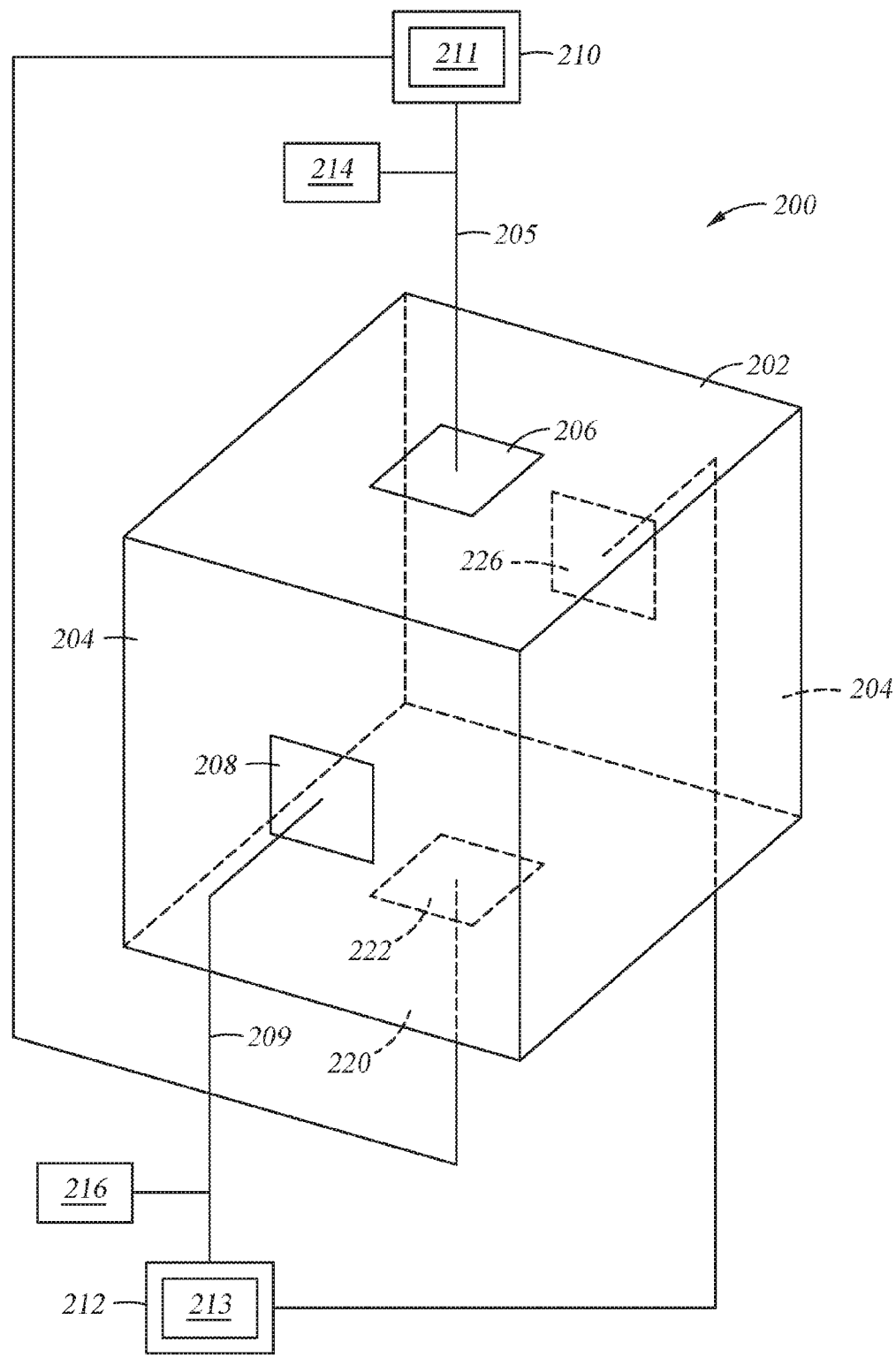
FIG. 2 is a schematic perspective view of an enclosure for enclosing the system shown in FIG. 1 according to embodiments disclosed herein.

FIG. 2 is a schematic perspective view of an enclosure 200 for enclosing the system shown in FIG. 1 according to embodiments disclosed herein. The system 100 may be enclosed in the enclosure 200 during operation. In order to prevent contamination of the substrate 140, gas may be flowed through the enclosure 200. Gas may include air, nitrogen gas or any other suitable gas or gases. In order to maintain signal integrity of the interferometers 142, gas flow inside the enclosure 200 may be controlled to be laminar. As shown in FIG. 2, the enclosure 200 may include a ceiling 202 and side walls 204. In one embodiment, a gas vent 206 may be disposed in the ceiling 202, and is connected to a gas source 210 via a gas duct 205. During operation, gas is supplied to the gas vent 206 from the gas source 210, and the gas flows from the ceiling 202 to a floor 220 on which the system 100 and the enclosure 200 is supported. An exhaust port 222 may be formed in the floor 220. In other words, gas flow is directed from the top of the enclosure 200 to the bottom of the enclosure. The gas source 210 may be located over the processing unit 164 and the exhaust port 222 may be located below the processing unit 164. The gas exiting the enclosure 200 from the exhaust port 222 may be sent back to the gas source 210. In some embodiments, the gas source 210 does not introduce any gas in addition to the gas existing the enclosure 200. In other words, the gas recirculates into and out of the enclosure 200. The gas source 210 may be utilized to ensure that the temperature of the gas entering the enclosure 200 remains constant. A temperature control device 211, such as a heat exchanger, may be located inside of the gas source 210. Small changes in temperature can affect accuracy of the system 100 since components of the system 100 may grow thermally. The gas flow inside the enclosure 200 may be laminar, which is controlled either at the gas source 210 or by a flow regulator 214 coupled to the gas duct 205.

Alternatively, a gas vent 208 may be disposed in one of the side walls 204. The gas vent 208 may be connected to a gas source 212 via a gas duct 209. During operation, gas is supplied to the gas vent 208 from the gas source 212, and the gas flow is directed from the side wall 204 to an opposite side wall 204. An exhaust port 226 may be formed in the opposite side wall 204. In other words, gas is flowed from side to side. Again the gas exiting the enclosure 200 from the exhaust port 226 may be sent back to the gas source 212. In some embodiments, the gas source 212 does not introduce any gas in addition to the gas existing the enclosure 200. In other words, the gas recirculates into and out of the enclosure 200. The gas source 212 may be utilized to ensure that the temperature of the gas entering the enclosure 200 remains constant. A temperature control device 213, such as a heat exchanger, may be located inside of the gas source 212. The gas flow inside the enclosure 200 may be laminar, which is controlled either at the gas source 212 or by a flow regulator 216 coupled to the gas duct 209. The side to side laminar gas flow within the enclosure 200 can reduce the chance of creating gas eddies, since gas obstacles, such as the base frame 110 and the slab 120, are avoided.

Figure 3A:
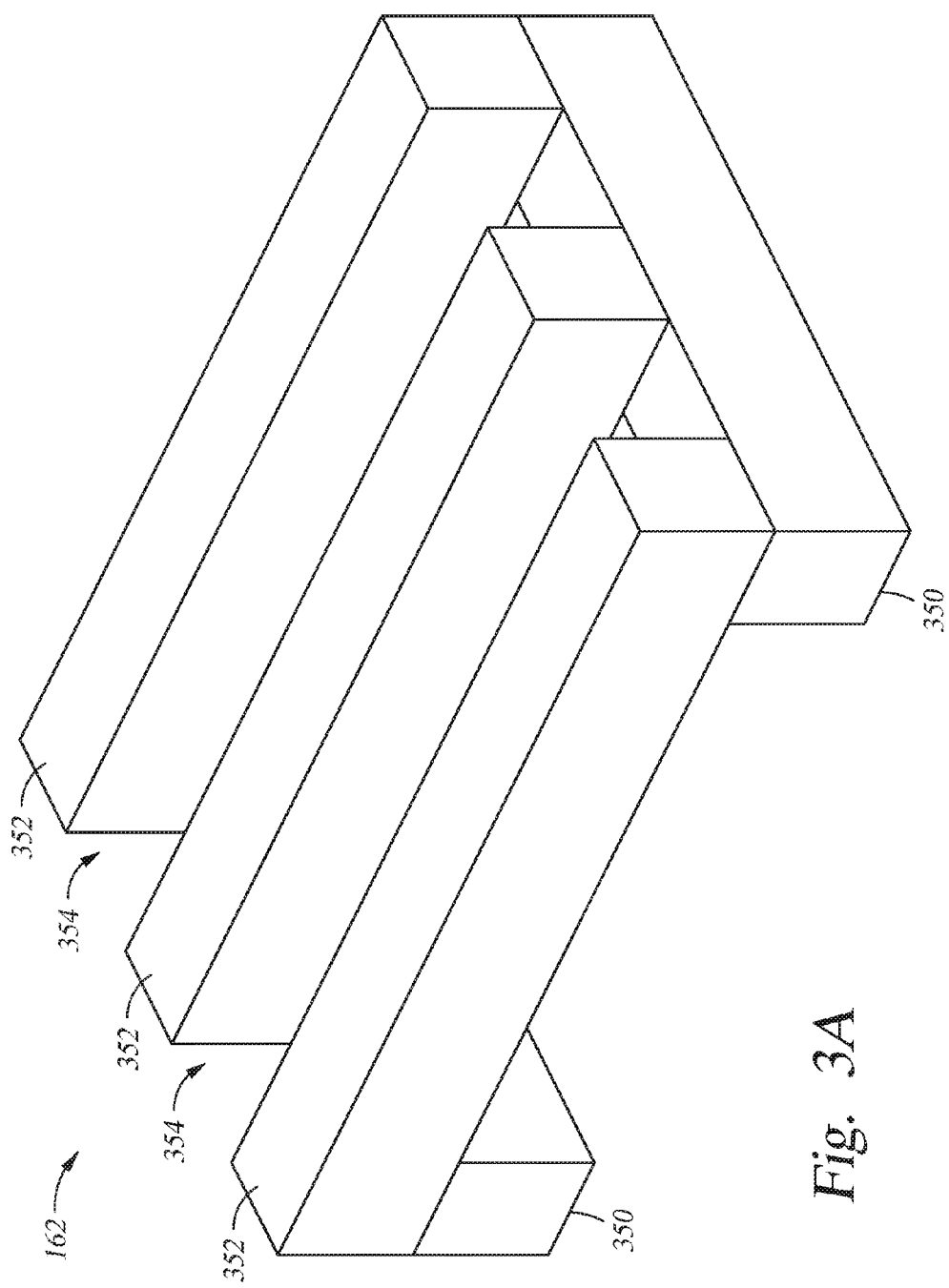
FIGS. 3A-3B are schematic perspective views of a support of the system shown in FIG. 1 according to embodiments disclosed herein.

FIG. 3A is a schematic perspective view of the support 162 of the system 100 shown in FIG. 1 according to embodiments disclosed herein. As shown in FIG. 3A, the support 162 may include a base 350 disposed on the slab 120 and a plurality of beams 352 for supporting the processing unit 164 (FIG. 1). One or more gaps 354 may be formed between adjacent beams 352. The maskless direct patterning may be performed on the substrate 140 (FIG. 1) by the processing unit 164 through gaps 354 between adjacent beams 352. The beams 352 may be substantially parallel. Because the interferometers 142 may be disposed in the gaps 354 (i.e., adjacent the base 350 not under the beams 352), laminar air flow provided by the gas vent 206, 208 can reach the interferometers.

Figure 3B:
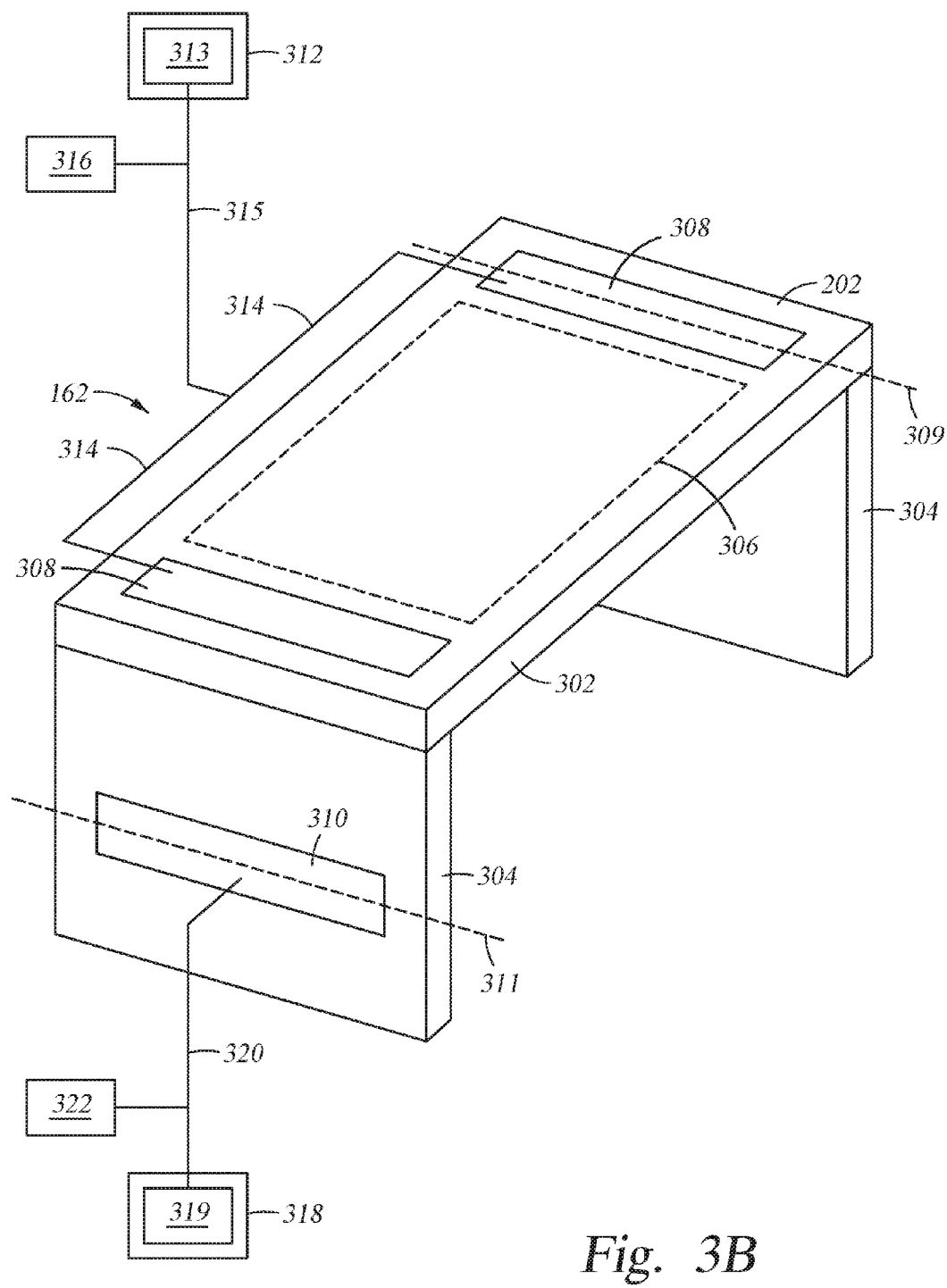

FIG. 3B is a schematic perspective view of the support 162 of the system 100 shown in FIG. 1 according to embodiments disclosed herein. As shown in FIG. 3, the support 162 may include a ceiling 302 for supporting the processing unit 164 (FIG. 1). The location of the processing unit 164 on the ceiling 302 is shown by area 306 defined by dotted lines. The ceiling 302 may be substantially parallel to the slab 120 (FIG. 1). The support 162 may further include side walls 304 supporting the ceiling 302. The side walls 304 may be substantially parallel to each other. The ceiling 302 and side walls 304 may define the opening 166 (FIG. 1). Because the interferometers 142 may be disposed within the opening 166 (i.e., adjacent the side walls 304 and under the ceiling 302), gas vents may be formed in the support 162 in order to provide laminar gas flow in areas where interferometers 142 are located. In one embodiment, one or more gas vents 308 may be formed in the ceiling 302, and the one or more gas vents 308 may be directly above the interferometers 142. Each gas vent 308 may have a longitudinal axis 309 that is in the X-direction (FIG. 1). The one or more gas vents 308 may be coupled to a gas source 312 via one or more gas ducts 314. Gas may include air, nitrogen gas or any other suitable gas or gases. In one embodiment, two gas vents 308 are formed in the ceiling 302, and the area 306 is between the gas vents 308. Each gas vent is coupled to one gas duct 314, and both gas ducts 314 are coupled to a gas duct 315. The gas duct 315 is coupled to the gas source 312. In other embodiments, each gas duct 314 is coupled to a distinct gas source. Gas flow is directed from the ceiling 302 to the slab 120 (FIG. 1). In other words, the gas flow is from top to bottom. The gas flow in areas of the interferometers 142 may be laminar, which is controlled either at the gas source 312 or by a flow regulator 316 coupled to the gas duct 315.

An alternative method for providing laminar gas flow in areas of the interferometers 142 is to have a gas vent 310 formed in one side wall 304, and the gas vent 310 may be coupled to a gas source 318 via a gas duct 320. The gas vent 310 may have a longitudinal axis 311 that is in the X-direction (FIG. 1). Gas flow is directed from one side wall 304 to the other side wall 304. In other words, the gas flow is from side to side. Again the gas flow in areas of the interferometers 142 may be laminar, which is controlled either at the gas source 318 or by a flow regulator 322 coupled to the gas duct 320. The gas vents 308, 310 may be provided in additional or alternative of the gas vents 206, 208 (FIG. 2). If gas vents in both the support 162 and enclosure 200 are utilized, either top to bottom or side to side gas flow in both the support 162 and the enclosure 200 is provided. The gas source 312 or 318 may be in addition to the gas source 210 or 210, and the gas source 312 or 318 may also include a temperature control device 313 or 319, respectively, for maintaining the temperature of the laminar gas flow.

Figure 4:
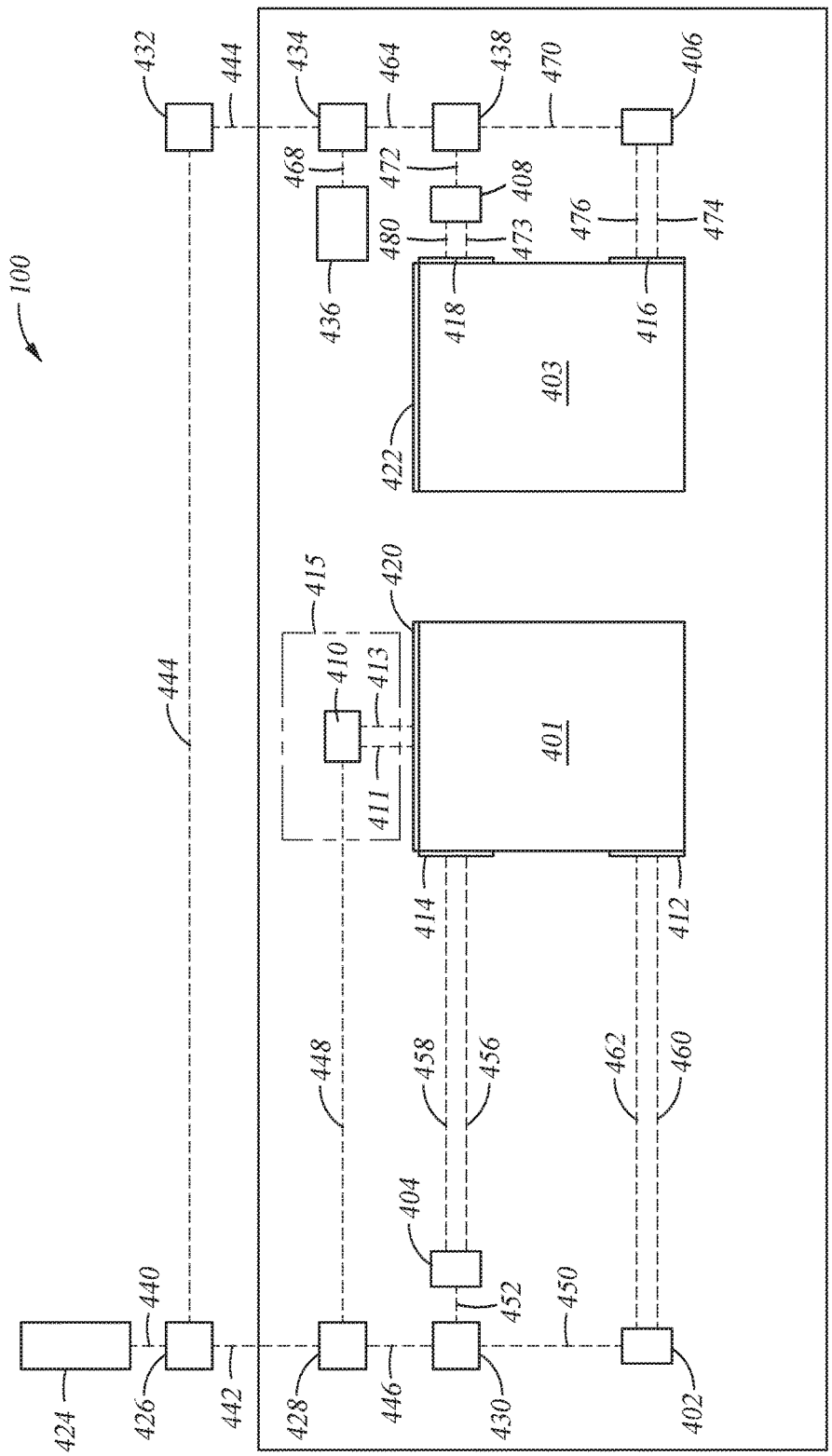
FIG. 4 is a schematic top view of the system shown in FIG. 1 according to embodiments disclosed herein.

FIG. 4 is a schematic top view of the system 100 according to embodiments disclosed herein. To better illustrate the chucks 130 and the interferometers 402, 404, 406, 408, 410, the processing apparatus 160 is omitted. The interferometers 402, 404, 406, 408, 410 may be the interferometers 142 shown in FIG. 1. As shown in FIG. 4, a plurality of mirrors 412, 414, 416, 418, 420, 422 may be coupled to chucks 401, 403 and the mirrors 412, 414, 416, 418 may be aligned in the X-direction and Z-direction with the interferometers 402, 404, 406, 408, respectively. The mirrors 420, 422 may be aligned in the Z-direction with the interferometer 410. The chucks 401, 403 may be the chucks 130 shown in FIG. 1 and the mirrors 412, 414, 416, 418, 420, 422 may be the mirrors 144 shown in FIG. 1. The chuck 401 is at the processing position, as shown in FIG. 4. The chucks 401, 403 are aligned in the X-direction, and the interferometers 402, 404 and the interferometers 406, 408 are disposed along in the Y-direction, which is substantially perpendicular to the X-direction. In some embodiments, the mirrors 412, 414 and the mirrors 416, 418 may be a single piece of mirror that covers the entire length of the side of each chuck 401, 403.

A laser source 424 may be utilized to provide a laser beam 440 directed to a first beam splitter 426. The laser beam 440 may have any suitable wavelength, such as about 550 nm. The first beam splitter 426 splits the laser beam 440 to a first sub beam 442 and a second sub beam 444. The first sub beam 442 may be directed to a second beam splitter 428, which splits the first sub beam 442 to a third sub beam 446 and a fourth sub beam 448. The third sub beam 446 may be directed to a third beam splitter 430 and the fourth sub beam 448 may be directed to the interferometer 410. The fourth sub beam 448 may be the beam 411 out of the interferometer 410 directed to the mirror 420, and the mirror 420 reflects the beam 411, shown as a reflecting beam 413, back to the interferometer 410. The signal phase change between the beam 411 and the reflecting beam 413 is used to detect any change in the distance between the interferometer 410 and the mirror 420, i.e., any change in the Y-direction. Any change in the Y-direction can be translated into the location of the substrate (not shown) disposed on the chuck 401 with respect to the Y-direction during operation. In one embodiment, one interferometer 410 is disposed between the chucks 401, 403. During operation, the interferometer 410 measures the location of the substrate (not shown) disposed on the chuck 401 or 403 that is in operating position with respect to the Y-direction.

The third beam splitter 430 splits the third sub beam 446 into a fifth sub beam 450 directed to the interferometer 402 and a sixth sub beam 452 directed to the interferometer 404. Similarly, the interferometer 402 directs a beam 460 to the mirror 412, which directs a reflecting beam 462 back to the interferometer 402, and the interferometer 404 directs a beam 456 to the mirror 414, which directs a reflecting beam 458 back to the interferometer 404. The interferometers 402, 404 detect any change in distance between the interferometers 402, 404 and the mirrors 412, 414, respectively, i.e., any change in the X-direction. Any change in the X-direction can be translated into the location of the substrate (not shown) disposed on the chuck 401 with respect to the X-direction during operation.

The second sub beam 444 may be directed to a mirror 432 which directs the second sub beam 444 to a fourth beam splitter 434. The fourth beam splitter 434 splits the second sub beam 444 to a seventh sub beam 468 directed to a wavelength tracker 436 and an eighth sub beam 464 directed to a fifth beam splitter 438. The wavelength of the laser beams can be affected by the environment conditions such as temperature, pressure, or humidity. The wavelength tracker 436 tracks changes in the air's index of refraction to optically compensate for environmental changes. The fifth beam splitter 438 splits the eighth sub beam 464 to a ninth sub beam 472 directed to the interferometer 408 and a tenth sub beam 470 directed to the interferometer 406. Similarly, the interferometer 408 directs a beam 473 to the mirror 418, which directs a reflecting beam 480 back to the interferometer 408, and the interferometer 406 directs a beam 474 to the mirror 416, which directs a reflecting beam 476 back to the interferometer 406. The interferometers 406, 408 detect any change in distance between the interferometers 406, 408 and the mirrors 416, 418, respectively, i.e., any change in the X-direction. Any change in the X-direction can be translated into the location of the substrate (not shown) disposed on the chuck 403 with respect to the X-direction during operation. As shown in FIG. 4, for each chuck, two interferometers are utilized to measure the location of the substrate with respect to the X-direction, while for both chucks, one interferometer is utilized to measure the location of the substrate with respect to the Y-direction. The location of and the number of beam splitters may vary.

An area 415 defined by the dotted lines is directly under the gas vent 308 shown in FIG. 3. Thus, beams 411, 413 may be exposed to laminar gas flow provided by the gas vent 308. Similarly, all beams may be exposed to laminar gas flow provided either by gas vents 308, 206 or by gas vents 310, 208. Due to the laminar gas flow, signal integrity of the interferometers is maintained.

Figure 5A:
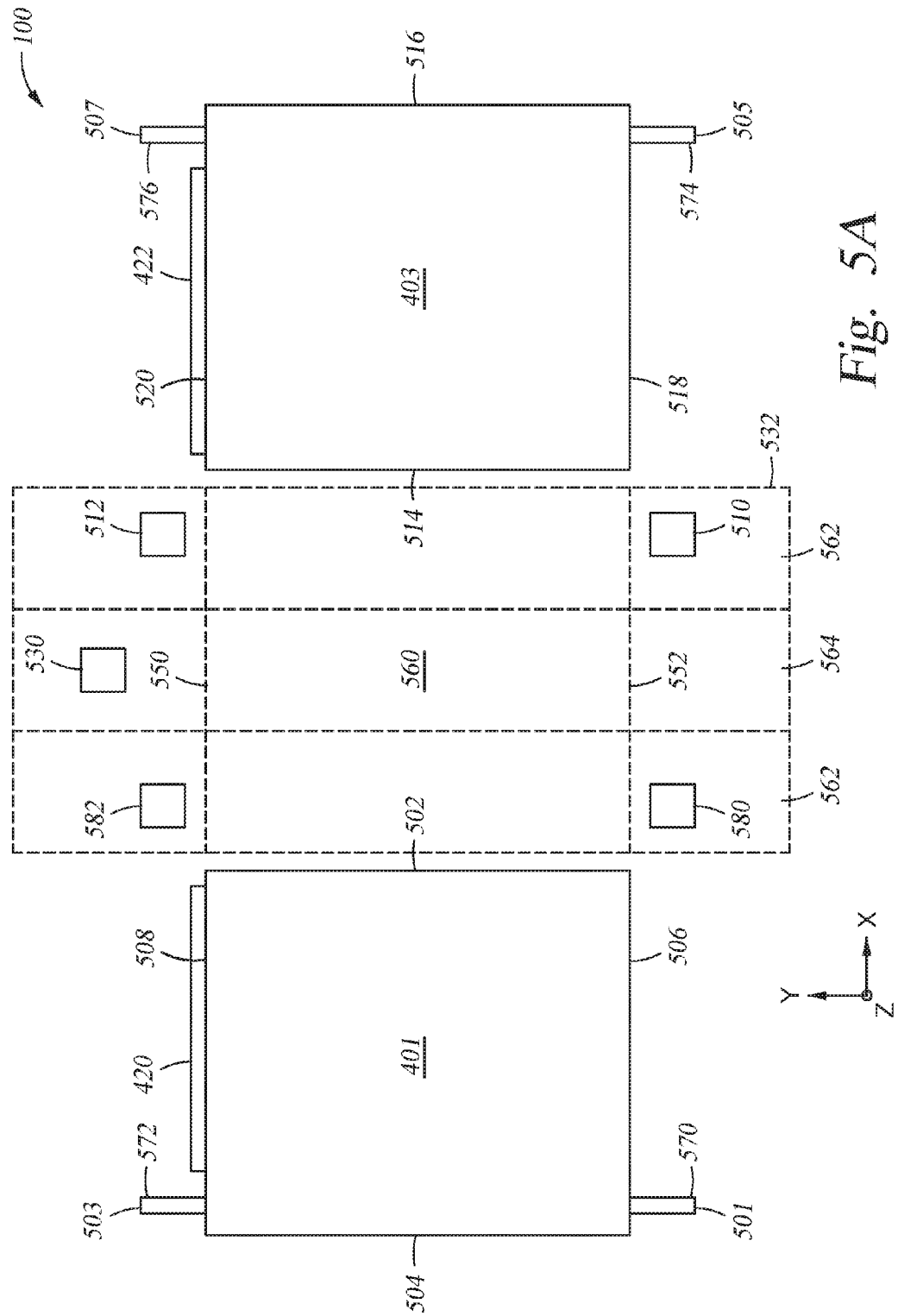
FIGS. 5A-5B are schematic top views of the system shown in FIG. 1 according to embodiments disclosed herein.
Figure 5B:
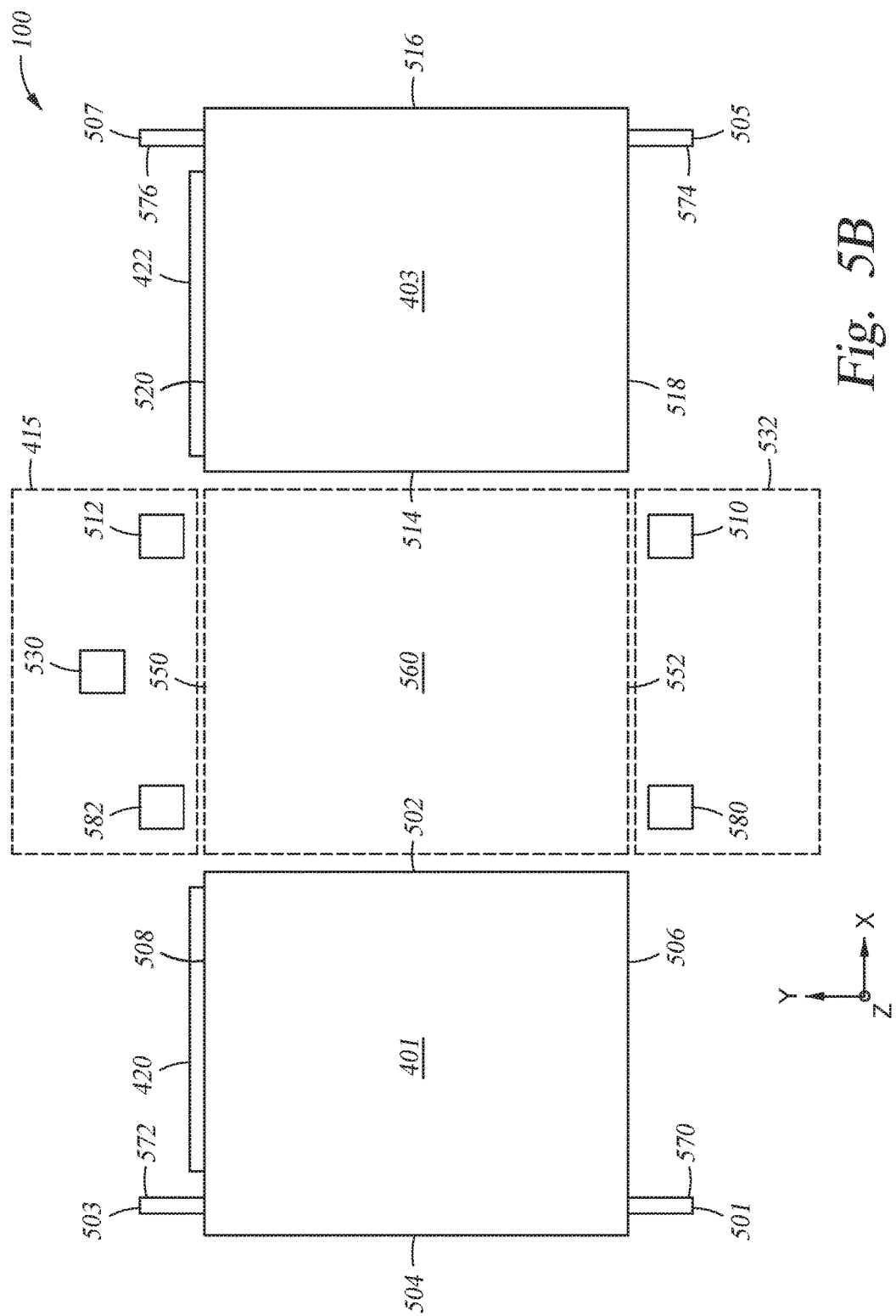

FIG. 5A is a schematic top view of the system 100 according to another embodiment. The system 100 may include the chucks 401, 403. The first chuck 401 includes a first side 502, a second side 504 opposite the side 502, a third side 506 connecting the first side 502 and the second side 504, and a fourth side 508 opposite the third side 506. In some embodiments, the first and second sides 502, 504 are substantially parallel, and the third and fourth sides 506, 508 are substantially parallel. Mirrors 501, 503 may be disposed on sides 506, 508 of chuck 401, respectively. The second chuck 403 includes a first side 514, a second side 516 opposite the first side 514, a third side 518 connecting the first side 514 and the second side 516, and a fourth side 520 opposite the third side 518. In some embodiments, the first and second sides 514, 516 are substantially parallel, and the third and fourth sides 518, 520 are substantially parallel. Mirrors 505, 507 may be disposed on sides 518, 520 of chuck 403, respectively. Mirrors 501, 503 may be aligned in the Z-direction, mirrors 505, 507 may be aligned in the Z-direction, but the mirror 501 or 503 is not aligned with the mirror 505 or 507 in the Z-direction, respectively. Mirrors 501, 503, 505, 507 may each include a surface 570, 572, 574, 576, respectively, for reflecting a laser beam. The surfaces 570, 572, 574, 576 may be substantially perpendicular to the sides 506, 508, 518, 520, respectively.

During operation, either chuck 401 or 403 is moved along the X-direction to the processing position, shown as chuck 560 represented by dotted lines. The chuck 560, which represents either the chuck 401 or chuck 403 in the processing position, includes sides 550, 552. As shown in FIG. 5A, interferometers 510, 580 may be disposed at a location adjacent the side 552, and interferometers 512, 582 may be disposed at a location adjacent the side 550. Interferometers 510, 580, 512, 582 may be disposed within the opening 166. The interferometer 510 is utilized to measure the location of the substrate disposed on the chuck 401 with respect to the X-direction, and the interferometer 580 is utilized to measure the location of the substrate disposed on the chuck 403 with respect to the X-direction. Thus, the interferometer 510 and the mirror 501 are aligned in the Z-direction, and the interferometer 580 and the mirror 505 are aligned in the Z-direction. The interferometer 510 and the mirror 501 are not aligned in the Z-direction with the interferometer 580 and the mirror 505 in order to prevent the mirror 501 or 505 from hitting the interferometer 580 or 510 during operation. The interferometer 512 is utilized to measure the location of the substrate disposed on the chuck 401 with respect to the X-direction, and the interferometer 582 is utilized to measure the location of the substrate disposed on the chuck 403 with respect to the X-direction. Thus, the interferometer 512 and the mirror 503 are aligned in the Z-direction, and the interferometer 582 and the mirror 507 are aligned in the Z-direction. The interferometer 512 and the mirror 503 are not aligned in the Z-direction with the interferometer 582 and the mirror 507 in order to prevent the mirror 503 or 507 from hitting the interferometer 582 or 512 during operation. The interferometers 510, 512 detect any change in distance between the interferometers 510, 512 and the mirrors 501, 503, respectively, i.e., any change in the X-direction. Any change in the X-direction can be translated into the location of the substrate (not shown) disposed on the chuck 401 with respect to the X-direction during operation. Due to the location of the interferometers 510, 512, the beam path from the interferometers 510, 512 to the mirrors 501, 503, respectively, is reduced. With reduced beam path, improved accuracy of the location measurement can be achieved. The interferometers 580, 582 detect any change in distance between the interferometers 580, 582 and the mirrors 505, 507, respectively, i.e., any change in the X-direction. Any change in the X-direction can be translated into the location of the substrate (not shown) disposed on the chuck 403 with respect to the X-direction during operation. Due to the location of the interferometers 580, 582, the beam path from the interferometers 580, 582 to the mirrors 505, 507, respectively, is reduced. With reduced beam path, improved accuracy of the location measurement can be achieved. An interferometer 530 may be disposed between the interferometers 512, 582 to detect any change in distance between the interferometer 530 and the mirror 420 or 422, i.e., any change in the Y-direction. Any change in the Y-direction can be translated into the location of the substrate (not shown) disposed on the chuck 401 or 403 with respect to the Y-direction during operation.

Additionally, interferometers 510, 512, 580, 582 may be disposed within areas 562, which correspond to gaps 354 (FIG. 3A) when the support 162 shown in FIG. 3A is used. An area 564 between the areas 562 is directly below a beam 352 (FIG. 3A). Thus, beams from and to the interferometers 510, 512, 580, 582 may be exposed to laminar gas flow provided by the gas vent 206 or 208. Due to the laminar gas flow, signal integrity of the interferometers is maintained.

Alternatively, when the support 162 as shown in FIG. 3B is used, interferometers 512, 530, 582 may be disposed within the area 415 and directly under the gas vent 308 shown in FIG. 3B. Thus, beams from and to the interferometers 512, 530, 582 may be exposed to laminar gas flow provided by the gas vent 308. Similarly, interferometers 510, 580 may be disposed within an area 532 defined by the dotted lines, and the area 532 may be directly under another gas vent 308 shown in FIG. 3B. Thus, beams from and to the interferometers 510, 580 may be exposed to laminar gas flow provided by the other gas vent 308. Due to the laminar gas flow, signal integrity of the interferometers is maintained.

Figure 6:
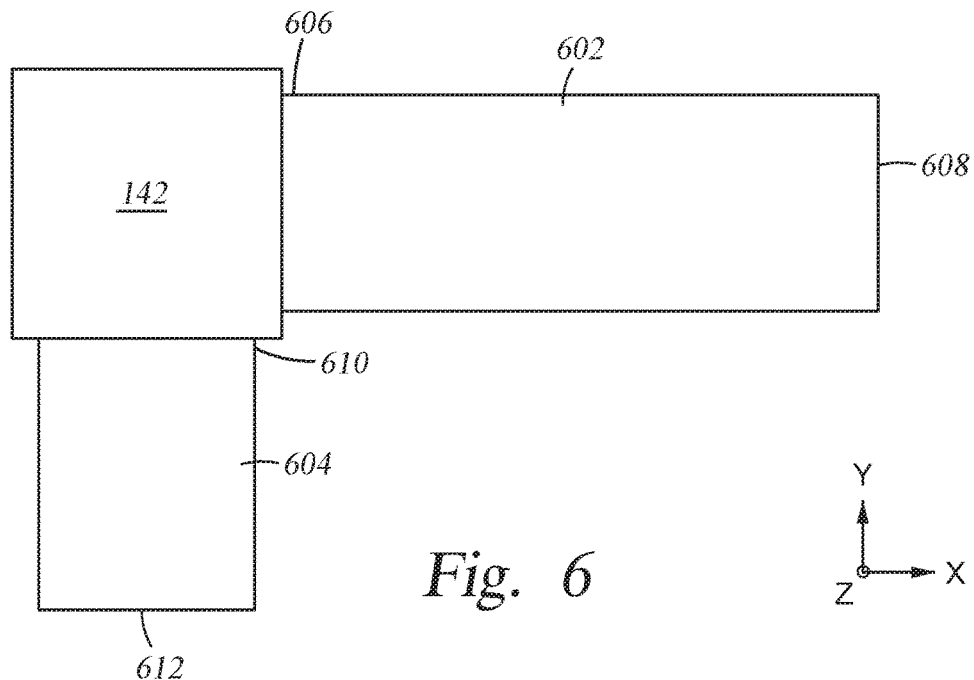
FIG. 6 is a schematic top view of an interferometer of the system shown in FIG. 1 according to embodiments disclosed herein.

FIG. 6 is a schematic top view of one interferometer 142 according to embodiments disclosed herein. As shown in FIG. 6, a tube 602 may be coupled to the interferometer 142, and the tube 602 may be a telescopic tube that can extend or retract in the X-direction. The tube 602 may include a first end 606 coupled the interferometer 142 and a second end 608 opposite the first end 606. A tube 604 may be coupled to the interferometer 142, and the tube 604 may be a telescopic tube that can extend or retract in the Y-direction. The tube 604 may include a first end 610 coupled the interferometer 142 and a second end 612 opposite the first end 610. The tubes 602, 604 may enclose the beams sent and received by the interferometer 142 in order to protect the beams and to maintain the signal integrity of the interferometer 142.

During operation, the tubes 602, 604 may extend or retract in length based on the distance between the interferometer 142 and the corresponding mirror. As the distance in X-direction between the interferometer 142 and the corresponding mirror increases, the tube 602 may extend in order to cover the majority of the beams between the interferometer 142 and the corresponding mirror. As the distance in X-direction between the interferometer 142 and the corresponding mirror decreases, the tube 602 may retract in order to cover the majority of the beams between the interferometer 142 and the corresponding mirror. Similarly, as the distance in Y-direction between the interferometer 142 and the corresponding mirror increases, the tube 604 may extend in order to cover the majority of the beams between the interferometer 142 and the corresponding mirror. As the distance in Y-direction between the interferometer 142 and the corresponding mirror decreases, the tube 604 may retract in order to cover the majority of the beams between the interferometer 142 and the corresponding mirror. There may be a gap between the second end 608 or 612 of the tube 602 or 604 and the corresponding mirror during the extension or retraction of the tube 602 or 604. The gap ensures that during operation the mirror and the tube 602 or 604 are not in contact, which could damage the mirror or the interferometer. The tubes 602, 604 may be coupled to all interferometers 142 disposed within the system 100 in order to protect beams sent and received by the interferometers 142.

Figure 7:
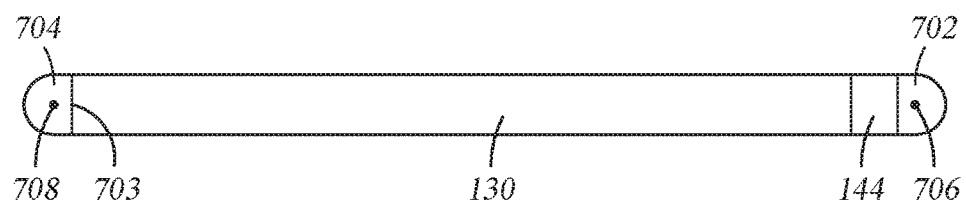
FIG. 7 is a schematic side view of a portion of a chuck of the system shown in FIG. 1 according to embodiments disclosed herein.

FIG. 7 is a schematic side view of a portion of the chuck 130 of the system shown in FIG. 1 according to embodiments disclosed herein. As shown in FIG. 6, a first gas cowling 702 may be coupled to the mirror 144, and a second gas cowling 704 may be coupled to an end 703 of the chuck 130 opposite the mirror 144. The first gas cowling 702 may have a longitudinal axis 706 that is substantially perpendicular to the X-direction, and the second gas cowling 704 may have a longitudinal axis 708 that is substantially perpendicular to the X-direction. As the chuck 130 moving in the X-direction during operation, gas cowlings 702, 704 help reduce drag, thus reduce gas eddies that can create gas turbulence. Any suitable gas cowling may be used for gas cowlings 702, 704. In one embodiment, gas cowlings 702, 704 may each have a curved outer surface. All of the chucks 130 disposed within the system 100 may include the gas cowlings 702, 704.

Figure 8:
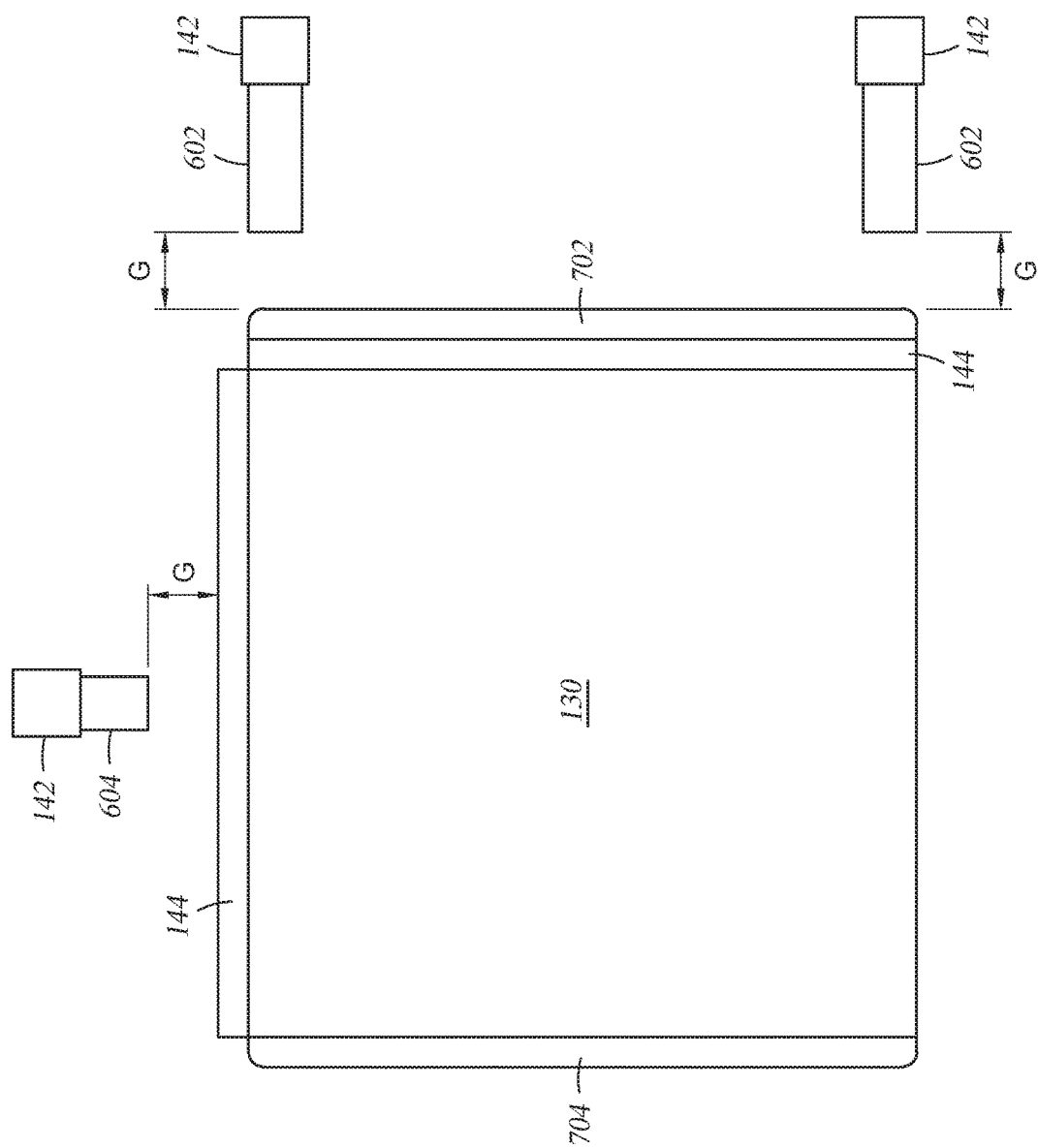
FIG. 8 is a schematic top view of the chuck and interferometers of system shown in FIG. 1 according to embodiments disclosed herein.

FIG. 8 is a schematic top view of the chuck 130 and interferometers 142 according to embodiments disclosed herein. As shown in FIG. 7, gas cowlings 702, 704 are coupled to opposite ends of the chuck 130, two interferometers 142 are utilized to measure the location of the chuck 130 in the X-direction, and one interferometer 142 is utilized to measure the location of the chuck 130 in the Y-direction. One tube 602 is coupled to each interferometer 142 measuring the location of the chuck 130 in the X-direction, and one tube 604 is coupled to the interferometer 142 measuring the location of the chuck 130 in the Y-direction. As described above, a gap G may be formed between the tubes 602 and the gas cowling 702 and between the tube 604 and the mirror 144 during operation in order to protect the mirrors 144 and the interferometers 142.

In summary, a photolithography system is disclosed. The environment within the photolithography system may be controlled so the gas flow within the system is laminar. Laminar gas flow helps maintain signal integrity of sensors disposed within the photolithography system. Examples of the sensors may be interferometers. Maintaining signal integrity of the interferometers leads to improved accuracy of the measurement of the location of a substrate disposed inside the photolithography system.

While the foregoing is directed to embodiments of the present disclosure, other and further embodiments of the disclosure may be devised without departing from the basic scope thereof, and the scope thereof is determined by the claims that follow.

The invention claimed is:

1. A photolithography system, comprising:
a processing unit;
a chuck having a substrate receiving surface, wherein the chuck is disposed below the processing unit and movable in an X-direction and an Y-direction;
a plurality of interferometers for measuring a displacement of the chuck in the X-direction and the Y-direction; and
one or more tubes coupled to each interferometer of the plurality of interferometers, wherein the one or more tubes are one or more telescopic tubes.

2. The photolithography system of claim 1, further comprising a gas source coupled to the gas vent, wherein the gas source includes a temperature control device.

3. The photolithography system of claim 2, further comprising an exhaust port disposed below the chuck, wherein the gas source is coupled to the exhaust port.

4. The photolithography system of claim 1, further comprising one or more gas cowlings coupled to one or more ends of the chuck.

5. A photolithography system, comprising:
a processing unit;

a chuck having a substrate receiving surface, wherein the chuck is disposed below the processing unit and movable in an X-direction and an Y-direction;

a plurality of interferometers for measuring a displacement of the chuck in the X-direction and the Y-direction; and a gas vent located over the processing unit, wherein a laminar flow of gas is directed from the gas vent toward the chuck.

6. The photolithography system of claim 5, further comprising a gas source coupled to the gas vent, wherein the gas source includes a temperature control device.

7. The photolithography system of claim 6, further comprising an exhaust port disposed below the chuck, wherein the gas source is coupled to the exhaust port.

8. The photolithography system of claim 5, further comprising one or more gas cowlings coupled to one or more ends of the chuck.

9. The photolithography system of claim 5, wherein the gas vent is located directly above one or more interferometers of the plurality of interferometers.

10. The photolithography system of claim 5, wherein the plurality of interferometers include two interferometers for measuring the displacement of the chuck in the X-direction.

* * * * *